US006528794B1

United States Patent
Sato

(10) Patent No.: US 6,528,794 B1
(45) Date of Patent: Mar. 4, 2003

(54) RADIATION DETECTING APPARATUS

(75) Inventor: Kenji Sato, Otsu (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 09/455,508

(22) Filed: Dec. 6, 1999

(30) Foreign Application Priority Data

Dec. 10, 1998 (JP) .......................................... 10-351309
Apr. 9, 1999 (JP) .......................................... 11-102528

(51) Int. Cl.$^7$ .............................................. G01T 1/24
(52) U.S. Cl. ............................ 250/370.09; 250/370.12; 250/370.13
(58) Field of Search ........................ 250/370.09, 370.12, 250/370.13

(56) References Cited

U.S. PATENT DOCUMENTS

| | | | | |
|---|---|---|---|---|
| 3,077,386 A | * | 2/1963 | Blakney et al. ............ | 423/568 |
| 3,640,812 A | * | 2/1972 | Vossen Jr. et al. ........ | 204/192.17 |
| 4,127,860 A | * | 11/1978 | Beelitz et al. ............. | 257/479 |
| 4,233,514 A | | 11/1980 | Kingsley ................. | 250/370.01 |
| 5,335,219 A | * | 8/1994 | Ovshinsky et al. ......... | 369/288 |
| 5,396,072 A | | 3/1995 | Schiebel et al. ........... | 250/370.09 |
| 5,677,538 A | * | 10/1997 | Moustakas ............... | 250/370.12 |
| 5,677,539 A | * | 10/1997 | Apotavsky et al. ........ | 250/370.13 |
| 5,693,947 A | * | 12/1997 | Morton .................. | 250/370.09 |
| 5,729,021 A | * | 3/1998 | Brauers et al. ............ | 250/370.09 |
| 5,892,227 A | * | 4/1999 | Schieber et al. .......... | 250/370.12 |
| 5,936,249 A | * | 8/1999 | Eisen et al. ............. | 250/370.06 |

OTHER PUBLICATIONS

PCT—WO 96 03773, Radiation Imaging Panel, dated Feb. 8, 1996.
Patent Abstracts of Japan, "Radiation Detecting Element", dated Dec. 6, 1989, JP 01 302775.

* cited by examiner

Primary Examiner—David Porta
Assistant Examiner—Shun Lee
(74) Attorney, Agent, or Firm—Rader, Fishman & Grauer PLLC

(57) ABSTRACT

A radiation detecting apparatus having an enlarged detection area and improved radiation detecting sensitivity includes a semiconductor layer formed of an n-type amorphous or polycrystal semiconductor of high specific resistance, with a $\mu\tau$ product (mobility×mean life) of holes being larger than a $\mu\tau$ product of electrons. The semiconductor layer has a surface electrode formed on one surface thereof to which a negative bias voltage is applied, and a carrier collection electrode formed on the other surface. The semiconductor layer provides an electronic injection inhibiting structure on the surface electrode side thereof, and a hole injection permitting structure on the carrier collection electrode side. In time of detecting radiation, electrons which are majority carriers are not injected from the surface electrode side into the semiconductor layer, while holes which are minority carriers are injected from the carrier collection electrode side. As a result, sensitivity is improved by a degree corresponding to the holes injected. The amorphous or polycrystal semiconductor layer realizes an increased area.

33 Claims, 8 Drawing Sheets

RADIATION DETECTING APPARATUS

BACKGROUND OF THE INVENTION

(1) Field of the Invention

This invention relates to radiation detecting apparatus of the direct conversion type used in the medical, industrial, nuclear and other fields, and more particularly to a technique of improving the sensitivity for detecting radiation.

(2) Description of the Related Art

Radiation detecting apparatus employing semiconductor detectors include the indirect conversion type which first converts radiation (e.g. X rays) into light and then converts the light into electric signals by photoelectric conversion, and the direct conversion type which converts incident radiation directly into electric signals with a radiation sensitive semiconductor layer. The direct conversion type apparatus has electrodes formed on opposite surfaces of the radiation sensitive semiconductor layer. A predetermined voltage is applied to one of the electrodes (voltage application electrode). The other electrode (carrier collection electrode) collects carriers generated by incident radiation. The carriers are taken out as radiation detection signals, thereby enabling a detection of the radiation.

A conventional radiation detecting apparatus of the direct conversion type employs a single crystal semiconductor as a material for the semiconductor layer. The single crystal semiconductor is used since it has excellent carrier transport characteristics compared with an amorphous or polycrystal semiconductor having numerous localized levels and grain boundaries. The conventional radiation detecting apparatus, with the excellent carrier transport characteristics of the single crystal semiconductor, is used as a radiation energy detector or a radiation pulse counter.

Since only the carriers generated by incident radiation are taken out as signals, the conventional radiation detecting apparatus needs structures on both the opposite electrode sides for inhibiting carrier injection from the electrodes. Thus, the conventional apparatus has the following specific construction.

As shown in FIG. 1, the conventional apparatus may include a single crystal semiconductor layer 51 of high specific resistance, which is doped with impurities to make one side p-type and the other side n-type. Structures 52 and 53 are formed on the opposite sides of semiconductor layer 51 to inhibit injection of electrons e and holes h, respectively. Alternatively, as shown in FIG. 2, the conventional apparatus may include an n-type (or p-type) single crystal semiconductor layer 61 of relatively low specific resistance, which may be doped with an impurity to make one side p-type (or n-type) or may have a structure 62 in the form of a barrier metal electrode on the one side to inhibit injection of electrons e (or holes h). The other side is guarded against injection of holes h (or electrons e) by the conductivity of the crystal per se. In FIGS. 1 and 2, the left electrode acts as a bias voltage application electrode, and the right electrode as a carrier collection electrode.

However, the conventional radiation detecting apparatus has a drawback that it can hardly meet a demand for an enlarged detecting area. In each of the medical, industrial, nuclear and other fields today, there is a strong demand for a semiconductor type radiation detecting apparatus with a large area and high sensitivity to realize a high-speed, highly sensitive and compact radiation detecting system. Under current conditions, a 3-inch diameter is the limit for radiation detecting, single crystal semiconductor materials. It is difficult to realize a semiconductor type radiation detecting apparatus with a large area and high sensitivity.

With an amorphous or polycrystal semiconductor, on the other hand, 1000 cm$^2$ and larger sizes may be achieved by using a thin film making technique. However, sensitivity is insufficient because of the presence of localized levels and grain boundaries. Here again, it is difficult to realize a semiconductor type radiation detecting apparatus with a large area and high sensitivity.

SUMMARY OF THE INVENTION

This invention has been made having regard to the state of the art noted above, and its object is to provide a semiconductor type radiation detecting apparatus with a large area and high sensitivity.

The above object is fulfilled, according to a first aspect of this invention, by a radiation detecting apparatus for converting incident radiation into electric signals, comprising:

a radiation sensitive semiconductor layer for generating carriers in form of electron-hole pairs in response to the incident radiation;

a pair of electrodes formed on opposite surfaces of the semiconductor layer, respectively, one of the electrodes being a voltage application electrode to which a negative bias voltage is applied, the other electrode being a carrier collection electrode;

a charge storing capacitor connected to the carrier collection electrode for storing charges generated by movement of the carriers in the semiconductor layer;

a switching element connected to the capacitor, the switching element being turned off when the charges accumulate in the capacitor, and turned on when taking the charges out of the capacitor; and charge-to-voltage converter means for converting the charges taken out of the capacitor through the switching element into voltage signals acting as radiation detection signals;

wherein the semiconductor layer is formed of one of an n-type amorphous semiconductor and an n-type polycrystal semiconductor, both being of high specific resistance, with a $\mu\tau$ product of holes being larger than a $\mu\tau$ product of electrons, the $\mu\tau$ product being a product of mobility $\mu$ and mean life $\tau$ of the electrons and holes generated by the incident radiation; and wherein the semiconductor layer has a structure formed on a voltage application electrode side thereof for inhibiting injection of electrons, and a structure formed on a carrier collection electrode side for permitting injection of holes.

The radiation detecting apparatus in the first aspect of the invention, as shown in FIG. 3, includes a radiation sensitive semiconductor layer 1A formed of an n-type amorphous or polycrystal semiconductor of high specific resistance, with the $\mu\tau$ product of holes h larger than the $\mu\tau$ product of electrons e among the carriers generated. When radiation is detected by this detecting apparatus, the holes h which are the minority carriers in the semiconductor layer 1A contribute to the radiation detection. A negative bias voltage $-V_A$ is applied from a bias voltage supply Ve to one electrode side of semiconductor layer 1A. Consequently, holes h are promptly injected from a hole injection permitting structure 3A formed on the carrier collection electrode side of semiconductor layer 1A, in a quantity corresponding to the quantity of the carriers generated by the incident radiation. The semiconductor layer 1A has a high specific resistance, whereby the injection of holes h is not inhibited by the conductivity of the semiconductor layer 1A per se. On the other hand, an injection of electrons e is inhibited by an electron injection inhibiting structure 2A formed on the voltage application electrode side of semiconductor layer 1A.

In the prior art, the injection of both holes h and electrons e is inhibited. The first aspect of the invention inhibits only the injection of electrons e which are the majority carriers not contributing to the improvement in sensitivity. Only the injection of holes h which contribute to the improvement in sensitivity is permitted to improve the sensitivity by a degree corresponding to the increase in the holes h. The holes h injected are the minority carriers in the semiconductor layer 1A, and thus an increase in dark current is suppressed. Of course, the detection area may be enlarged since the semiconductor layer 1A is formed of an amorphous or polycrystal semiconductor material.

Charges generated by movement of holes h accumulate in a charge storing capacitor Ca while a switching element 4 is turned off. When the switching element 4 is turned on, the charges stored are read from a charge-to-voltage converter 5 as voltage signals acting as radiation detection signals. Thus, a detecting operation is not interrupted, with holes h accumulating in the capacitor Ca, even during a non-signal reading period, which provides an advantage in terms of sensitivity. Further, in the case of a multichannel construction, the charge-to-voltage converter 5 for reading detection signals may be arranged switchable for connection to a plurality of capacitors, thereby reducing the number of charge-to-voltage converters 5 required.

Next, the detecting sensitivity of the radiation detecting apparatus in the first aspect of the invention will be described in terms of quantity.

Current i flowing when an electric field E is applied and radiation (X rays) is emitted to a semiconductor layer 1 having a sectional area S and a thickness corresponding to a distance d between the electrodes, is expressed by $i=\Delta i+i_D$ (where $\Delta i$ is a signal current portion, and $i_D$ is a dark current portion). The signal current portion $\Delta i$ is expressed by the following equation (1):

$$\Delta i = q\Delta n \cdot \mu E S = q(\Delta n_e \mu_e + \Delta n_h \mu_h)ES \quad (1)$$

where $\Delta n$ is an increase in carriers, $\mu E$ is a moving speed of the carriers, $\Delta n_e$ is an increase in electrons, $\Delta n_h$ is an increase in holes, and q is a quantum of electricity.

On the other hand, where the quantity of carriers generated per unit volume and unit time is g (cm$^{-3}$ sec$^{-1}$), since irradiation is assumed to be steady (dg/dt=0), a change with the passage of time of $\Delta n$ is expressed by $d\Delta n(t)/dt=g-\Delta n(t)/\tau$ (where $\tau$ is a mean life of the carriers). This equation is solved to obtain $\Delta n(t)=g\tau[1-\exp(-t/\tau)]$. Where $t>>\tau$, $\Delta n(t)=g\tau$ and the following equations (2) and (3) are obtained:

$$\Delta n_e = g_e \tau_e \quad (2)$$

$$\Delta n_h = g_h \tau_h \quad (3)$$

Since $g_e=g_h=g$, the above equations are substituted into equation (1) to obtain equation (4):

$$\Delta i = qgES(\mu_e\tau_e+\mu_h\tau_h) = qgdS(\mu_e\tau_e E/d)+(\mu_h\tau_h E/d) \quad (4)$$

Further, since the injection of electrons e is inhibited here, equation (4) becomes equation (5).

$$\Delta i = qgdS(\mu_h\tau_h E)/d \quad (5)$$

In this case, since $\mu_e \tau_e << \mu_h \tau_h$, the value of $\Delta i$ hardly changes.

In the conventional radiation detecting apparatus, by contrast, since $g_e$ and $g_h$ in the equations (2) and (3) are replaceable with Hecht's equations (6) and (7) below, equation (4) above becomes equation (8):

$$g_e = g_e[1-\exp[-(d-r)/\mu_e\tau_e E]] \quad (6)$$

$$g_h = g_h[1-\exp[-r/\mu_h\tau_h E]] \quad (7)$$

$$\Delta i = qdS\{g_e[1-\exp[-(d-r)/\mu_e\tau_e E]](\mu_e\tau_e E/d)+g_h[1-\exp[-r/\mu_h\tau_h E]](\mu_h\tau_h E/d)\} \quad (8)$$

Further, the expression in { } of equation (8) approaches $[g_e(d-r)+g_h r]/d$ as E increases. This value is equal to g, and therefore equation (8) finally becomes equation (9).

$$\Delta i_{MAX} = qgdS \quad (9)$$

Equation (9) shows that, in the conventional (non-injection type) radiation detecting apparatus, signals do not depend on electric field E, but depend on g or carriers generated.

A comparison between equation (5) for the first aspect of this invention and equation (9) for the prior art shows that, in the first aspect of the invention, $\Delta i$ increases by $(\mu_h \tau_h E)/d$ times. The rate of increase is proportional to electric field E, and electric field E=bias voltage/distance between the electrodes. Consequently, the improvement in sensitivity increases with the bias voltage.

In a second aspect of the invention, there is provided a radiation detecting apparatus for converting incident radiation into electric signals, comprising:

a radiation sensitive semiconductor layer for generating carriers in form of electron-hole pairs in response to the incident radiation;

a pair of electrodes formed on opposite surfaces of the semiconductor layer, respectively, one of the electrodes being a voltage application electrode to which a positive bias voltage is applied, the other electrode being a carrier collection electrode;

a charge storing capacitor connected to the carrier collection electrode for storing charges generated by movement of the carriers in the semiconductor layer;

a switching element connected to the capacitor, the switching element being turned off when the charges accumulate in the capacitor, and turned on when taking the charges out of the capacitor; and a charge-to-voltage converter for converting the charges taken out of the capacitor through the switching element into voltage signals acting as radiation detection signals;

wherein the semiconductor layer is formed of one of an n-type amorphous semiconductor and an n-type polycrystal semiconductor, both being of high specific resistance, with a $\mu\tau$ product of holes being larger than a $\mu\tau$ product of electrons, the $\mu\tau$ product being a product of mobility $\mu$ and mean life $\tau$ of the electrons and holes generated by the incident radiation; and wherein the semiconductor layer has a structure formed on a voltage application electrode side thereof for permitting injection of holes, and a structure formed on a carrier collection electrode side for inhibiting injection of electrons.

With the radiation detecting apparatus in the second aspect of the invention, as shown in FIG. 4, a positive bias voltage $+V_A$ is applied from the bias voltage supply Ve to one electrode side of a semiconductor layer 1B. The semiconductor layer 1B has a hole injection permitting structure 2B formed on a voltage application electrode side thereof, and an electron injection inhibiting structure 3B on a carrier collection electrode side. This apparatus has the same functions as the apparatus in the first aspect of the invention except that the direction for injecting holes h is reversed. Thus, the other details will not be discussed.

In a third aspect of the invention, there is provided a radiation detecting apparatus for converting incident radiation into electric signals, comprising:

a radiation sensitive semiconductor layer for generating carriers in form of electron-hole pairs in response to the incident radiation;

a pair of electrodes formed on opposite surfaces of the semiconductor layer, respectively, one of the electrodes being a voltage application electrode to which a negative bias voltage is applied, the other electrode being a carrier collection electrode;

a charge storing capacitor connected to the carrier collection electrode for storing charges generated by movement of the carriers in the semiconductor layer;

a switching element connected to the capacitor, the switching element being turned off when the charges accumulate in the capacitor, and turned on when taking the charges out of the capacitor; and a charge-to-voltage converter for converting the charges taken out of the capacitor through the switching element into voltage signals acting as radiation detection signals;

wherein the semiconductor layer is formed of one of a p-type amorphous semiconductor and a p-type polycrystal semiconductor, both being of high specific resistance, with a $\mu\tau$ product of electrons being larger than a $\mu\tau$ product of holes, the $\mu\tau$ product being a product of mobility $\mu$ and mean life $\tau$ of the electrons and holes generated by the incident radiation; and wherein the semiconductor layer has a structure formed on a voltage application electrode side thereof for permitting injection of electrons, and a structure formed on a carrier collection electrode side for inhibiting injection of holes.

With the radiation detecting apparatus in the third aspect of the invention, as shown in FIG. 5, a radiation sensitive semiconductor layer 1C is formed of a p-type amorphous or polycrystal semiconductor of high specific resistance, with the $\mu\tau$ product of electrons e larger than the $\mu\tau$ product of holes h among the carriers generated. The electrons e which are the minority carriers in the semiconductor layer 1C contribute to the radiation detection. A negative bias voltage −$V_A$ is applied from the bias voltage supply Ve to one electrode side of semiconductor layer 1C. Electrons e are promptly injected from an electron injection permitting structure 2C formed on the electron application electrode side of semiconductor layer 1C, in a quantity corresponding to the quantity of the carriers generated by incident radiation. On the other hand, the semiconductor layer 1C has a hole injection inhibiting structure 3C formed on the voltage application electrode side thereof Thus, holes h are not injected, but only electrons e are injected.

Since the injection of holes h is inhibited here, the foregoing equation (5) becomes equation (10) below:

$$\Delta i = qgdS(\mu_e\tau_e E)/d \qquad (10)$$

Since $\mu_h \tau_h \ll \mu_e \tau_e$, the value of $\Delta i$, of course, hardly changes. Sensitivity is improved since $\Delta i$ increases by $(\mu_e \tau_e E)/d$ times.

This apparatus has the same functions as the apparatus in the first aspect of the invention in the other details. Thus, the other details will not be discussed.

In a fourth aspect of the invention, there is provided a radiation detecting apparatus for converting incident radiation into electric signals, comprising:

a radiation sensitive semiconductor layer for generating carriers in form of electron-hole pairs in response to the incident radiation;

a pair of electrodes formed on opposite surfaces of the semiconductor layer, respectively, one of the electrodes being a voltage application electrode to which a positive bias voltage is applied, the other electrode being a carrier collection electrode;

a charge storing capacitor connected to the carrier collection electrode for storing charges generated by movement of the carriers in the semiconductor layer;

a switching element connected to the capacitor, the switching element being turned off when the charges accumulate in the capacitor, and turned on when taking the charges out of the capacitor; and a charge-to-voltage converter for converting the charges taken out of the capacitor through the switching element into voltage signals acting as radiation detection signals;

wherein the semiconductor layer is formed of one of a p-type amorphous semiconductor and a p-type polycrystal semiconductor, both being of high specific resistance, with a $\mu\tau$ product of electrons being larger than a $\mu\tau$ product of holes, the $\mu\tau$ product being a product of mobility $\mu$ and mean life $\tau$ of the electrons and holes generated by the incident radiation; and wherein the semiconductor layer has a structure formed on a voltage application electrode side thereof for inhibiting injection of holes, and a structure formed on a carrier collection electrode side for permitting injection of electrons.

With the radiation detecting apparatus in the fourth aspect of the invention, as shown in FIG. 6, a positive bias voltage +$V_A$ is applied from the bias voltage supply Ve to one electrode side of a semiconductor layer 1D. The semiconductor layer 1D has an electron injection permitting structure 3D formed on a carrier collection electrode side thereof, and a hole injection inhibiting structure 2D on a voltage application electrode side. This apparatus has the same functions as the apparatus in the third aspect of the invention except that the direction for injecting electrons e is reversed. Thus, the other details will not be discussed.

In the radiation detecting apparatus in the first to fourth aspects of the invention, preferably, the bias voltage applied to the voltage application electrode has a value within a range where an absolute value |$V_A$| of the bias voltage is |$V_A$|>$d^2/\mu\tau_L$, where d is a distance between the electrodes, and $\mu\tau_L$ is the larger of the $\mu\tau$ products of the carriers.

With the bias voltage set as above, $\Delta i$ in equation (5) or (10) is larger than $\Delta i$ in equation (9), thereby reliably performing a radiation detecting operation with high sensitivity.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Preferred embodiments of the present invention will be described in detail hereinafter with reference to the drawings.

<First Embodiment>

Figure 1:
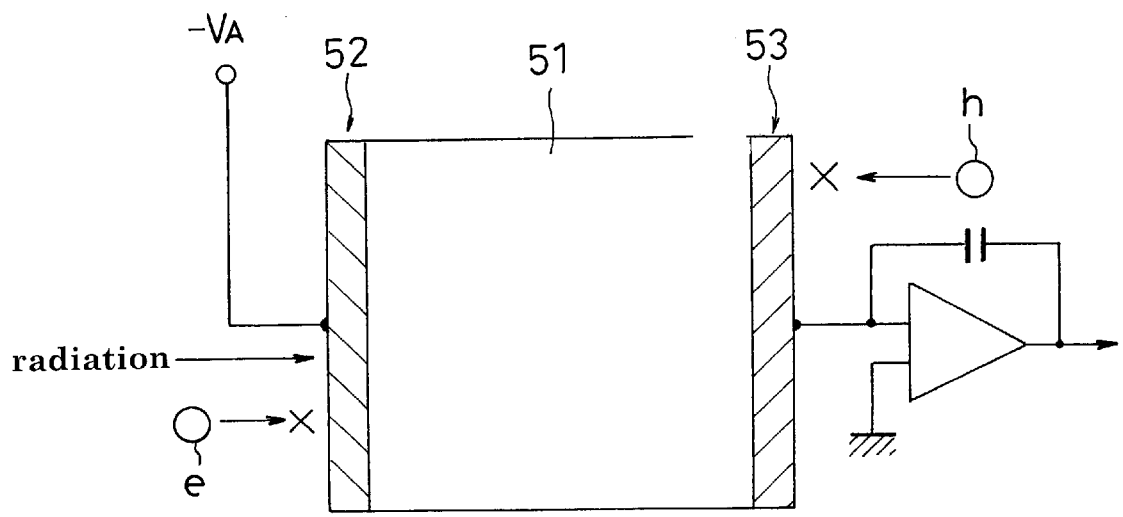
FIG. 1 is a schematic view showing a basic construction of a principal portion of a conventional radiation detecting apparatus.
Figure 2:
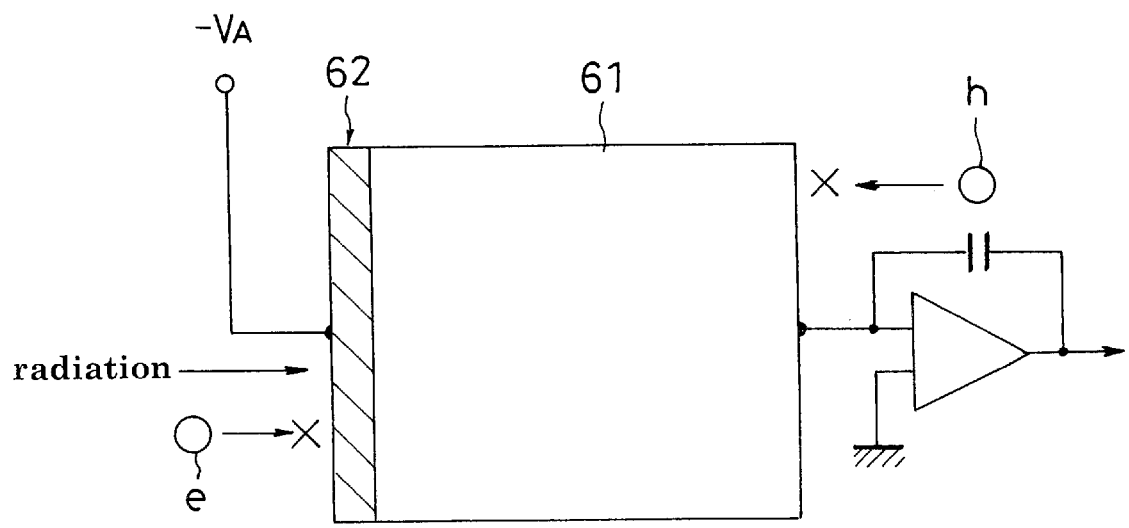
FIG. 2 is a schematic view showing a basic construction of a principal portion of another conventional radiation detecting apparatus.
Figure 3:
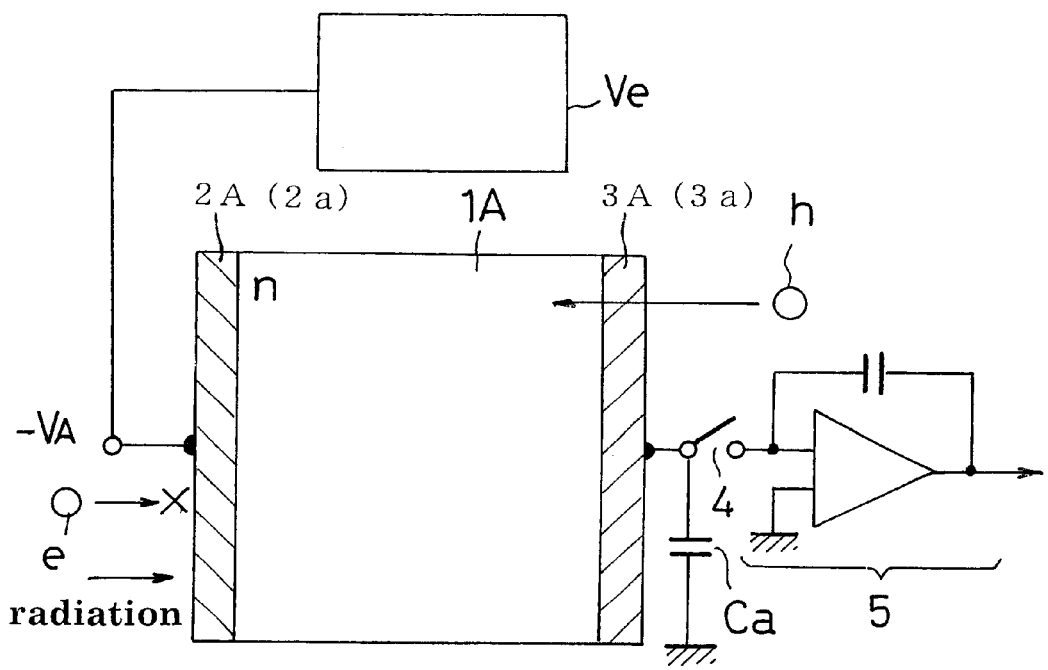
FIG. 3 is a schematic view showing a basic construction of a principal portion of a radiation detecting apparatus according to the first aspect of this invention.
Figure 7:
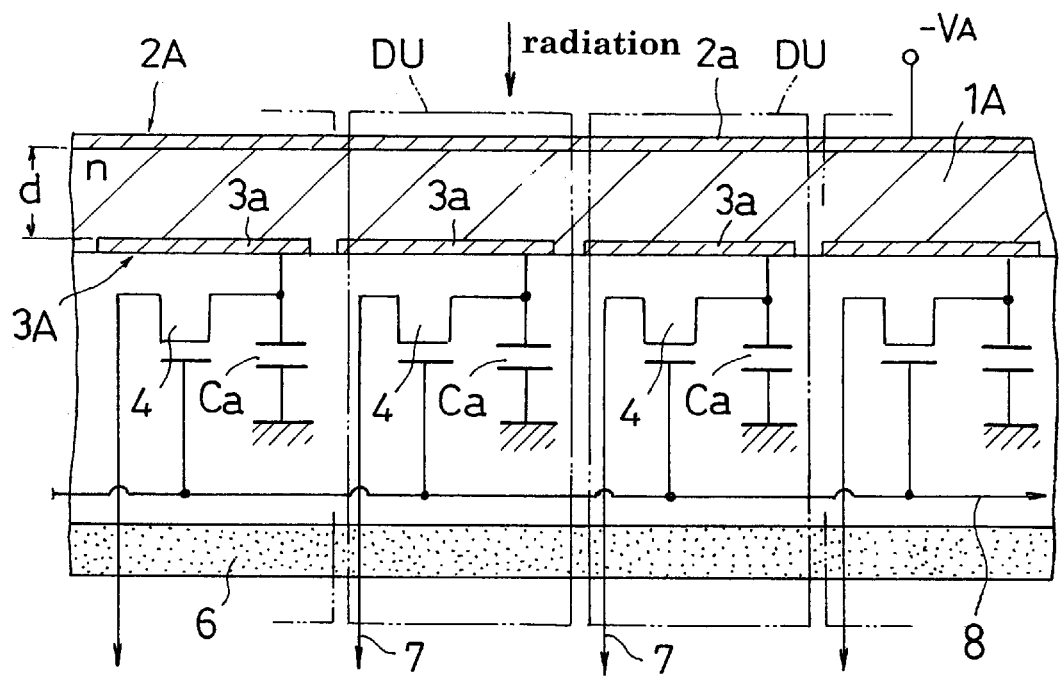
FIG. 7 is a schematic sectional view showing a radiation sensor in a first embodiment.
Figure 8:
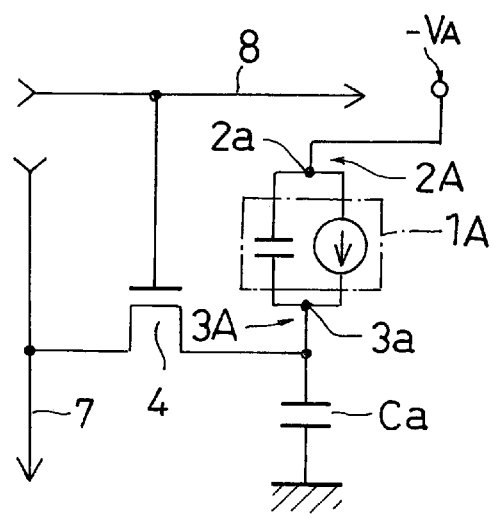
FIG. 8 is a basic electrical diagram of the radiation sensor in the first embodiment.
Figure 9:
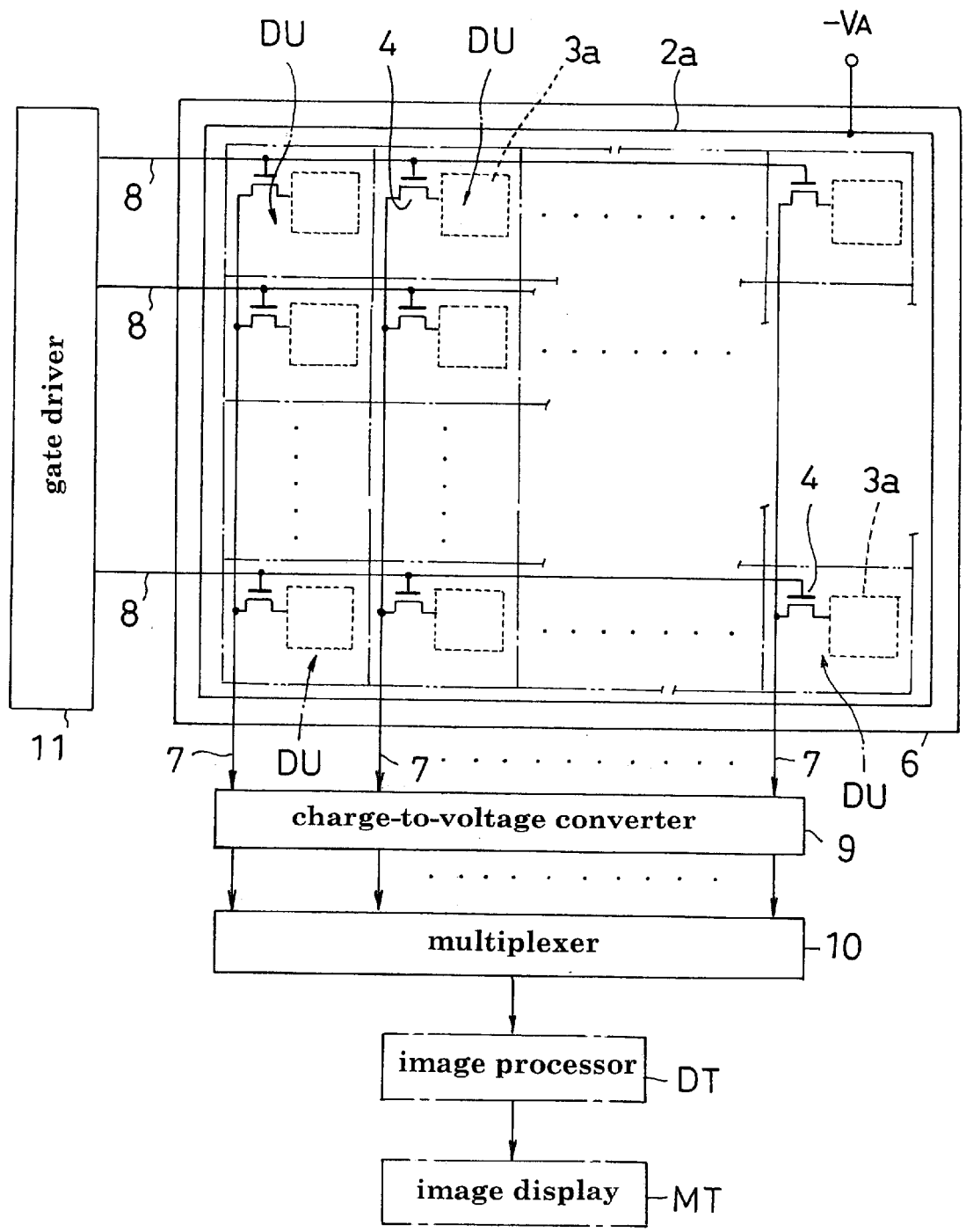
FIG. 9 is a plan view showing a construction of the radiation sensor in the first embodiment.

FIG. 3 is a schematic view showing a basic construction of a principal portion of a radiation detecting apparatus in a first embodiment (embodiment according to the first aspect of this invention). FIG. 7 is a schematic sectional view showing a radiation sensor in the first embodiment. FIG. 8 is a basic electrical diagram of the radiation sensor in the first embodiment. FIG. 9 is a plan view showing a construction of the radiation sensor in the first embodiment.

As shown in FIGS. 3 and 7, the radiation detecting apparatus in the first embodiment includes a radiation sensor having a radiation sensitive semiconductor layer 1A for generating carriers in response to incident radiation, a surface electrode (voltage application electrode) 2a disposed on a radiation incidence side of semiconductor layer 1A, carrier collection electrodes 3a arranged on a radiation non-incidence side (opposite from the radiation incidence side) of semiconductor layer 1A, charge storing capacitors Ca for storing charges generated by movement of the carriers in the semiconductor layer 1A, and thin film transistors (TFT) acting as switching elements 4, which are normally turned off (non-conductive), for taking out the charges stored in the capacitors Ca. The apparatus in the first embodiment further includes a bias voltage supply (power source) Ve for applying a negative bias voltage $-V_A$ to the surface electrode 2a. The carriers generated by incident radiation and carriers injected, with the bias voltage applied to the surface electrode 2a, move to the electrodes 3a, whereby charges accumulate in the capacitors Ca. In time of reading, the switching elements 4 are turned on (connected) whereby the charges are read and transmitted to charge-to-voltage converters (preamplifiers) 5 to be converted into radiation detection signals which are voltage signals. Each component will particularly be described hereinafter.

In the apparatus in the first embodiment, the semiconductor layer 1A is formed of an n-type amorphous semiconductor of high specific resistance with the $\mu\tau$ product of holes larger than the $\mu\tau$ product of electrons. This type of amorphous semiconductor includes, for example, non-dope amorphous selenium (a-Se) doped with no impurity, and alkali-dope amorphous selenium doped with an alkali metal such as Na. As used herein, the phrase "doped with no impurity" means that no impurity doping treatment is given deliberately. A desirable range of numerical values of high specific resistance is $10^9$ Ωcm or more, and preferably $10^{11}$ Ωcm or more. The amorphous semiconductor, of course, is a semiconductor material that realizes an enlarged detection area.

A metal for the surface electrode 2a may, for example, be Au, Pt or the like which forms a Schottky junction with the n-type semiconductor. A metal for the carrier collection electrodes 3a may be ITO (indium tin oxide), Ti, Ni or the like which forms an ohmic junction with the n-type semiconductor. That is, in the first embodiment, a Schottky junction formed between the semiconductor layer 1A and surface electrode 2a constitutes an electron injection inhibiting structure 2A on the voltage application electrode side. Ohmic junctions formed between the semiconductor layer 1A and carrier collection electrodes 3a constitute a hole injection permitting structure 3A on the carrier collection electrode side. Of course, the amorphous semiconductor and the metals for forming the electrodes are not limited to the materials cited above.

As shown in FIGS. 7 and 9, the radiation sensor of the apparatus in the first embodiment includes FET type thin film transistors acting as the switching elements 4 and the charge storing capacitors Ca, besides the semiconductor layer 1A and electrodes 2a and 3a, all formed on one insulating substrate 6. The capacitors Ca are in the form of $SiO_2$ layers or the like. The insulating substrate 6 is in the form of a glass substrate or the like.

Further, the radiation sensor of the apparatus in the first embodiment is in the form of an area sensor (two-dimensional sensor) with numerous radiation detecting elements DU (e.g. 1024×1024) arranged along X- and Y-directions. FIG. 3 shows one detecting element DU as a basic construction. As shown in FIGS. 7 and 9, the surface electrode 2a is formed throughout as a common electrode for all the detecting elements DU. The carrier collection electrodes 3a are formed as individual electrodes for the respective detecting elements DU. The switching elements 4 and capacitors Ca also are formed one each for the respective detecting elements DU.

In the radiation sensor in the first embodiment, as shown in FIG. 9, the switching elements (thin film transistors) 4 of detecting elements DU have sources thereof connected to sense lines 7 arranged in the horizontal (X) direction, and gates connected to sense lines 8 arranged in the vertical (Y) direction. The sense lines 7 are connected to a multiplexer 10 through a group of charge-to-voltage converters (group of preamplifiers) 9. The sense lines 8 are connected to a gate driver 11. In the charge-to-voltage converter group 9, one charge-to-voltage converter 4 as shown in FIG. 3 is connected to each sense line 7.

In the radiation sensor in the first embodiment, scan signals for fetching signals are inputted to the multiplexer 10 and gate driver 11. The detecting elements DU of the radiation sensor are identified by means of addresses (e.g. 0 to 1023) sequentially allocated to the detecting elements DU along the X- and Y-directions. Thus, the fetching scan signals serve as signals designating the addresses in the X-direction or Y-direction.

In response to scan signals for the Y-direction, the gate driver 11 applies a fetching voltage to the sense lines 8 arranged in the Y-direction. Then, detecting elements DU are selected on a column-by-column basis. When, the multiplexer 10 is switched by scan signals for the X-direction, the charges stored in the capacitors Ca of the detecting elements DU in the selected columns are successively outputted through the charge-to-voltage converter group 9 and multiplexer 10.

Where the radiation detecting apparatus in the first embodiment is used as an X-ray detector of a fluoroscopic X-ray apparatus, for example, detection signals of the detecting elements DU are successively taken out of the multiplexer 10 as pixel signals. Then, as shown in chain lines in FIG. 9, an image processor DT performs a necessary signal processing including a noise processing, and an image display MT displays a two-dimensional image (fluoroscopic image).

Thus, the detection signal fetching mode of the radiation sensor in the first embodiment can be said broadly similar to that of ordinary imaging devices such as TV cameras.

In the first embodiment, the radiation sensor may include an analog-to-digital converter (not shown), as necessary, in addition to the charge-to-voltage converter group 9, multiplexer 10 and gate driver 11, to promote an integrated construction. However, the charge-to-voltage converter group 9, multiplexer 10, gate driver 11 and the analog-to-digital converter may wholly or partly be installed separately.

In fabricating the radiation sensor in the first embodiment, the thin film transistors for switching elements 4, capacitors Ca, carrier collection electrodes 3a, semiconductor layer 1A and surface electrode 2a are successively laminated on a surface of insulating substrate 6 by using the thin film forming technique based on one of various vacuum deposition methods or the pattern forming technique based on a photolithographic method.

On the other hand, the bias voltage supply Ve is constructed to apply a voltage of minus (negative) polarity as the bias voltage to the surface electrode 2a, which voltage moves holes, among the carriers generated, from the radiation non-incident side toward the radiation incident side. The bias voltage supply Ve may be a fixed power supply for invariably outputting only a particular voltage, or may be a variable power supply for outputting voltages in a variable way.

In this case, holes h which contribute to radiation detection are injected from the carrier collection electrodes 3a in a quantity corresponding to the carriers generated by incident radiation. This results in an increase in detection signals by $(\mu_h \tau_h E)/d$ times in proportion to the bias voltage, to achieve a significant improvement in detecting sensitivity. The holes h are minority carriers in the semiconductor layer 1A, and therefore little dark current occurs therein.

In the radiation detecting apparatus in the first embodiment, the distance d between the electrodes (i.e. thickness of semiconductor layer 1A) may be 0.07 cm, the semiconductor layer 1A may be formed of a-Se, the $\mu\tau$ product of holes may be $10^{-6}$ cm$^2$/V, and the $\mu\tau$ product of electrons may be $10^{-7}$ cm$^2$/V. Then, a bias voltage in a range of $|-V_A|>4900V$ results in $(\mu_h \tau_h E)/d>1$, to assure a radiation detection with high sensitivity.

Further, in the apparatus in the first embodiment, a detecting operation continues, without interruption, with holes h accumulating in the capacitors Ca even outside a signal reading period. This is advantageous in terms of sensitivity. In a multi-channel construction as in the first embodiment, each charge-to-voltage converter 5 for reading may be constructed switchable for connection to a plurality of capacitors Ca. Thus, the number of charge-to-voltage converters 5 may be reduced to realize a compact construction. That is, the radiation detecting apparatus according to this invention may be said suitable to the high sensitivity multichannel type.

<Second Embodiment>

Figure 10:
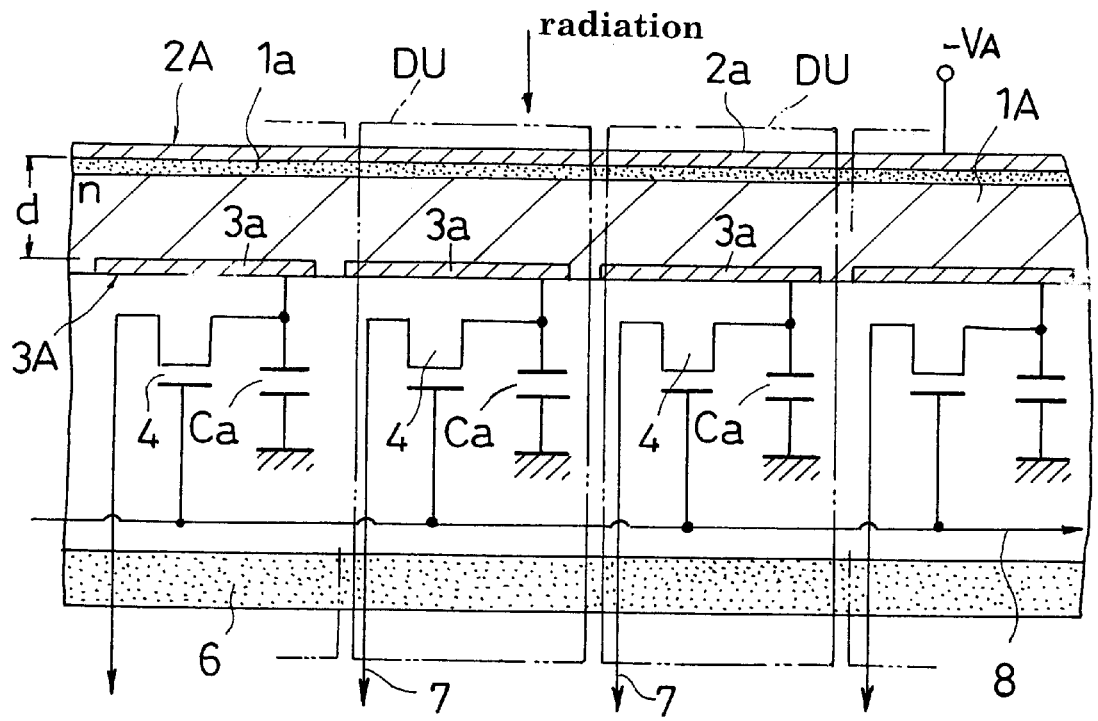
FIG. 10 is a schematic sectional view showing a radiation sensor in a second embodiment.

A second embodiment (another embodiment according to the first aspect of the invention) will be described next. FIG. 10 is a schematic sectional view showing a radiation sensor in the second embodiment.

As shown in FIG. 10, a radiation detecting apparatus in the second embodiment includes a p-type layer 1a of semiconductor film or organic film of low specific resistance formed between the surface electrode 2a and semiconductor layer 1A. A PN junction between the semiconductor layer 1A and p-type layer 1a constitutes the electron injection inhibiting structure 2A on the voltage application electrode side. Thus, the surface electrode 2a need not be formed of a material that provides a Schottky junction, The semiconductor film of low specific resistance for forming the p-type layer 1a may be Sb$_2$Te$_3$, Sb$_2$S$_3$ or ZnTe, for example. The organic film may be polycarbonate or the like mixed with a hole transfer agent.

The other details of the construction and function are the same as in the first embodiment described hereinbefore, and will not be described again.

<Third Embodiment>

Figure 11:
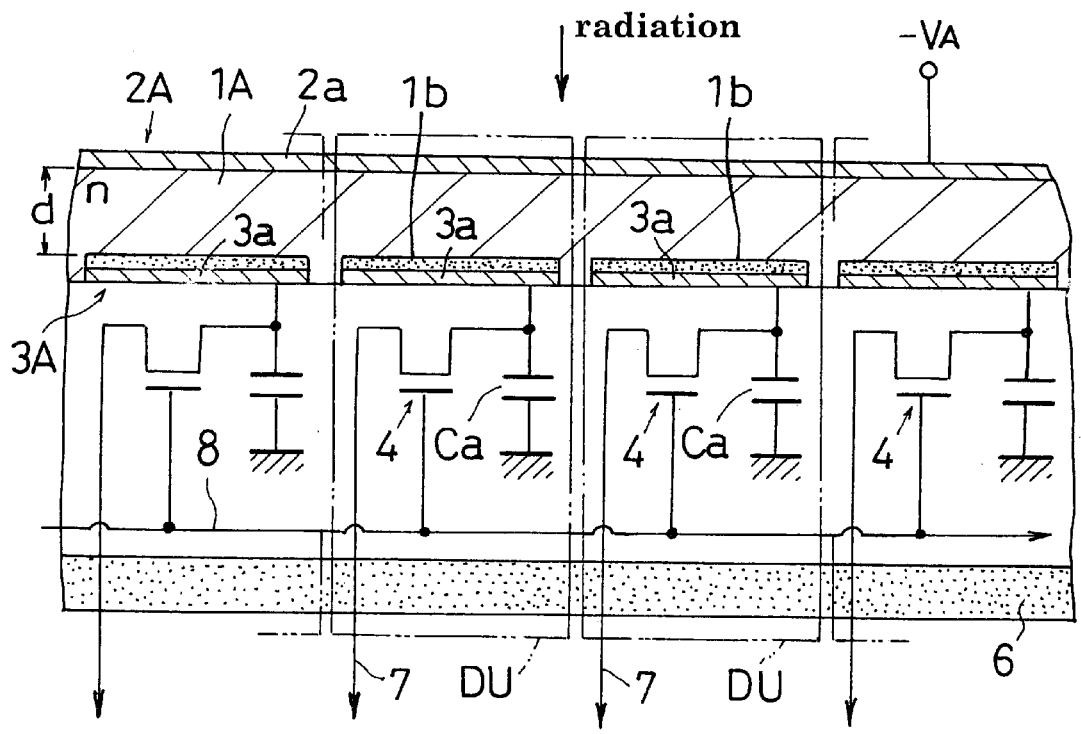
FIG. 11 is a schematic sectional view showing a radiation sensor in a third embodiment.

A third embodiment (further embodiment according to the first aspect of the invention) will be described next. FIG. 11 is a schematic sectional view showing a radiation sensor in the third embodiment.

As shown in FIG. 11, a radiation detecting apparatus in the third embodiment includes carrier selective injection layers 1b formed between the semiconductor layer 1A and carrier collection electrodes 3a. In the apparatus in the third embodiment, the carrier selective injection layers 1b are formed of a p-type semiconductor or organic film which tends to be injected with the holes having a large $\mu\tau$ product compared with the electron having a small $\mu\tau$ product. This p-type semiconductor may be, but is not limited to, Sb$_2$S$_3$, ZnTe or the like.

In the apparatus in the third embodiment, the carrier selective injection layers 1b arranged under the semiconductor layer 1A constitute the hole injection permitting structure 3A. Thus, the carrier collection electrodes 3a need not necessarily form ohmic junctions, but may form Schottky junctions. This feature provides an additional advantage that the carrier collection electrodes 3 may be selected from a wide range of materials. The other details of the construction and function are the same as in the first embodiment described hereinbefore, and will not be described again.

<Fourth Embodiment>

Figure 4:
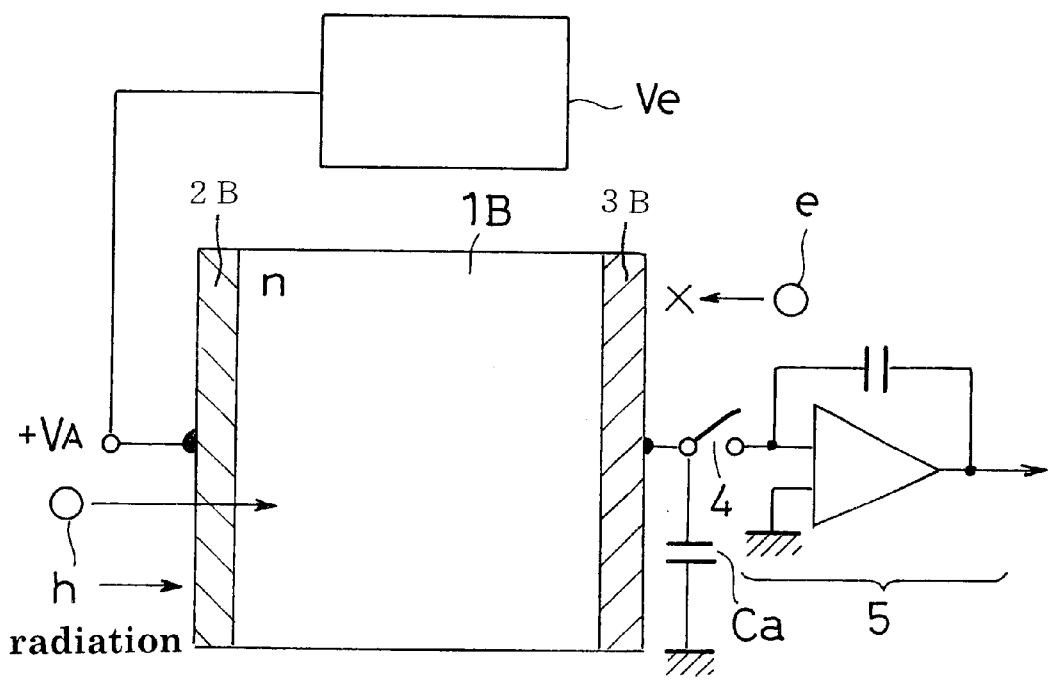
FIG. 4 is a schematic view showing a basic construction of a principal portion of a radiation detecting apparatus according to the second aspect of this invention.
Figure 12:
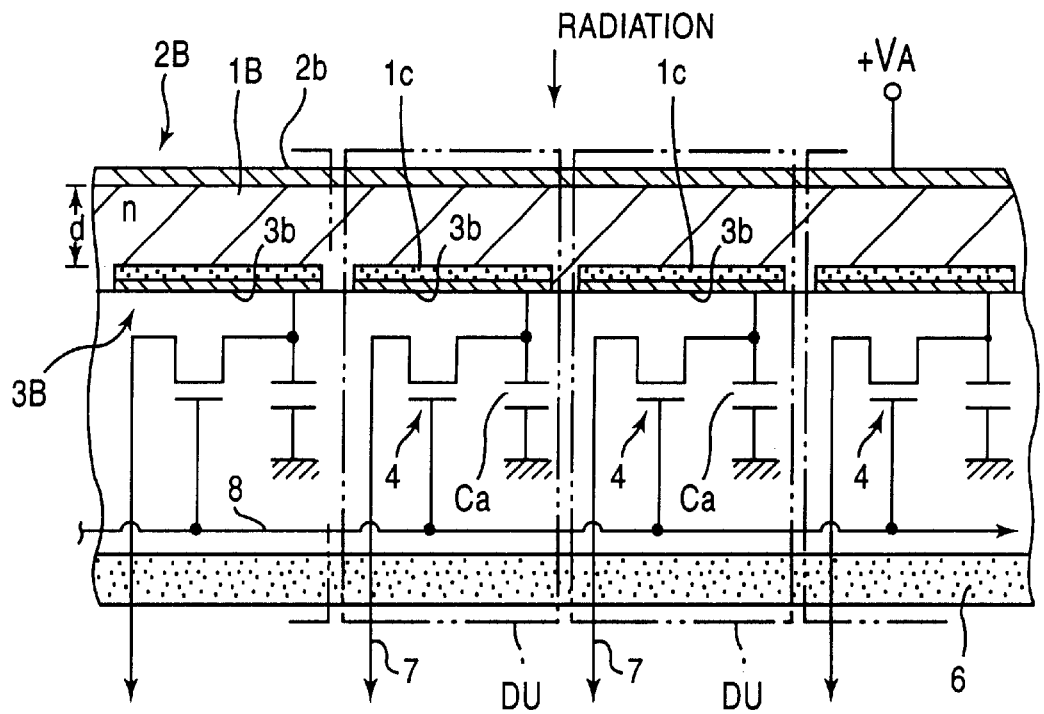
FIG. 12 is a schematic sectional view showing a radiation sensor in a fourth embodiment.

A fourth embodiment (embodiment according to the second aspect of the invention) will be described next. FIG. 4 is a schematic view showing a basic construction of a principal portion of a radiation detecting apparatus in the fourth embodiment. FIG. 12 is a schematic sectional view showing a radiation sensor in the fourth embodiment.

In the radiation detecting apparatus in the fourth embodiment, as shown in FIG. 12, a positive bias voltage $+V_A$ is applied to the surface electrode 2b. The carrier collection electrodes 3b are formed of a metal such as ITO, Ti or Ni. Further, p-type layers 1c of semiconductor film or organic film of low specific resistance are formed between a semiconductor layer 1B (e.g. non-dope amorphous selenium doped with no impurity or alkali-dope amorphous selenium doped with an alkali metal such as Na) and carrier collection electrodes 3b. The surface electrode 2b is formed of ITO, Ti, Ni or the like which forms an ohmic junction with an n-type semiconductor. The semiconductor film of low specific resistance for the p-type layer 1c may be $Sb_2Te_3$, $Sb_2S_3$ or ZnTe, for example. The organic film may be polycarbonate or the like mixed with a hole transfer agent. Thus, PN junctions between the semiconductor layer 1B and p-type layers 1c constitute an electron injection inhibiting structure 3B on the carrier collection electrode side. An ohmic junction between the semiconductor layer 1B and surface electrode 2b provides a hole injection permitting structure 2B on the voltage application electrode side. Consequently, holes h are injected in the opposite direction to that in the first embodiment. The other details of the construction and function are the same as in the first embodiment described hereinbefore, and will not be described again.

In the fourth embodiment, the carrier collection electrodes 3b may be formed of Au, Pt or the like which forms Schottky junctions with the n-type semiconductor, thereby allowing the p-type layers 1c to be omitted. However, this usually is undesirable since, in the case of a heavy metal such as Au or Pt, metal atoms could infiltrate into the thin film transistor forming the switching elements 4 below, thereby to degrade its property. The hole injection permitting structure 2B may be in the form of a p-type layer of semiconductor film or organic film of low specific resistance formed between the semiconductor layer 1B and surface electrode 2b.

<Fifth Embodiment>

Figure 5:
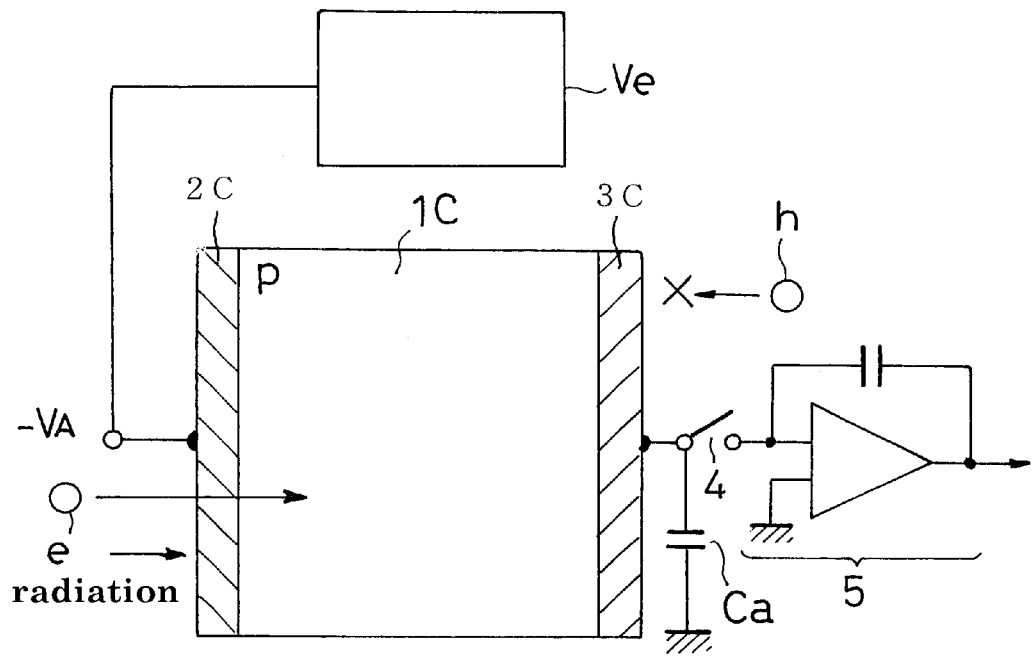
FIG. 5 is a schematic view showing a basic construction of a principal portion of a radiation detecting apparatus according to the third aspect of this invention.
Figure 13:
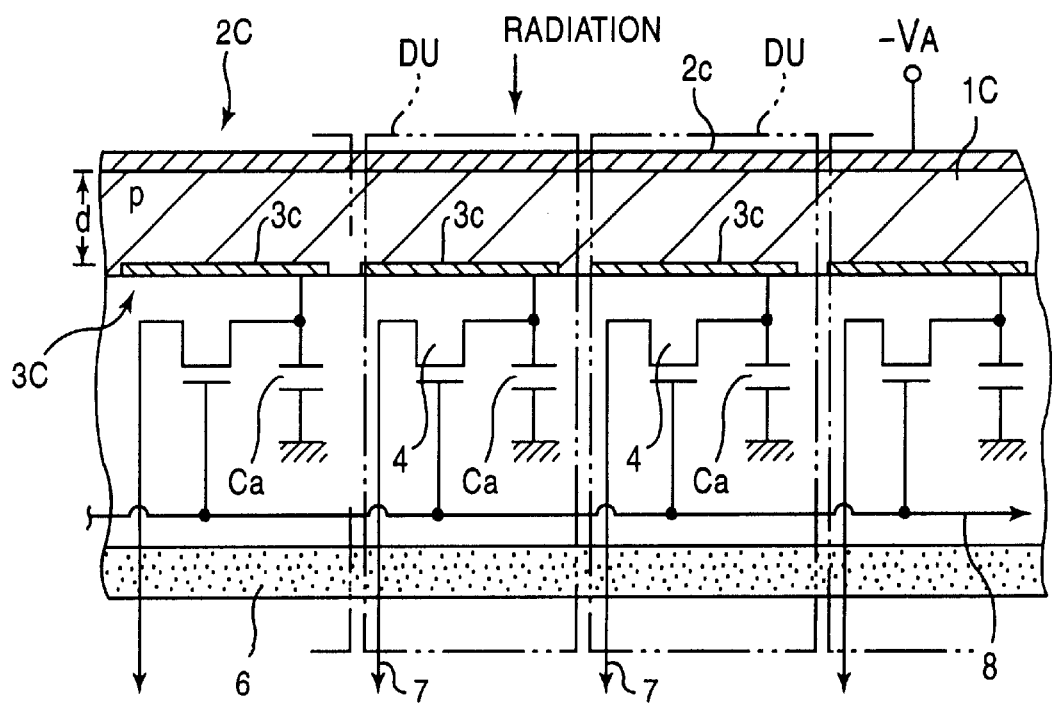
FIG. 13 is a schematic sectional view showing a radiation sensor in a fifth embodiment.

A fifth embodiment (embodiment according to the third aspect of the invention) will be described next. FIG. 5 is a schematic view showing a basic construction of a principal portion of a radiation detecting apparatus in the fifth embodiment. FIG. 13 is a schematic sectional view showing a radiation sensor in the fifth embodiment.

As shown in FIGS. 5 and 13, the radiation detecting apparatus in the fifth embodiment includes a radiation sensitive semiconductor layer 1C for generating carriers in response to incident radiation. The layer 1C is formed of a p-type polycrystal semiconductor of high specific resistance with the $\mu\tau$ product of electrons larger than the $\mu\tau$ product of holes. This polycrystal semiconductor which enables an enlarged detection area is not limited to a particular type, but may be a compound semiconductor such as CdZnTe, for example. A surface electrode 2c is formed of a metal such as Au or Pt which forms an ohmic junction with the p-type semiconductor. Carrier collection electrodes 3c are formed of a metal such as ITO or Ti which forms Schottky junctions with the p-type semiconductor. Of course, the polycrystal semiconductor and the metals for forming the electrodes are not limited to the materials cited above.

On the other hand, the bias voltage supply Ve is constructed to apply a voltage of minus (negative) polarity as the bias voltage to the surface electrode 2c, which voltage moves electrons, among the carriers generated, from the radiation incident side toward the radiation non-incident side.

Thus, in the apparatus in the fifth embodiment, the carriers contributing to radiation detection are electrons e. The ohmic junction formed between the semiconductor layer 1C and surface electrode 2c constitutes an electron injection permitting structure 2C on the voltage application electrode side. The Schottky junctions formed between the semiconductor layer 1C and carrier collection electrodes 3c constitute a hole injection inhibiting structure 3C on the carrier collection electrode side.

In this case, electrons e which contribute to radiation detection are injected from the surface electrode 2c in a quantity corresponding to the carriers generated by incident radiation. This results in an increase in detection signals by $(\mu_e \tau_e E)/d$ times in proportion to the bias voltage, to achieve a significant improvement in detecting sensitivity. The electrons e are minority carriers in the semiconductor layer 1C, and therefore little dark current occurs therein. In the radiation detecting apparatus in the fifth embodiment, the distance d between the electrodes (i.e. thickness of semiconductor layer 1C) is 0.03 cm, the semiconductor layer 1C is formed of CdZnTe, the $\mu\tau$ product of electrons may be $10^{-5}$ $cm^2/V$, and the $\mu\tau$ product of holes may be $10^{-6}$ $cm^2/V$. Then, a bias voltage of $|-V_A|>90V$ results in $(\mu_e \tau_e E)/d>1$, to assure a radiation detection with high sensitivity.

In this embodiment, the electron injection permitting structure provided on the voltage application electrode side of semiconductor layer 1C may be in the form of an n-type layer of semiconductor film or organic film of low specific resistance formed between the semiconductor layer 1C and voltage application electrode (surface electrode 2C).

The hole injection inhibiting structure provided on the carrier collection electrode side of semiconductor layer 1C may be in the form of n-type layers of semiconductor film or organic film of low specific resistance formed between the semiconductor layer 1C and carrier collection electrodes 3c.

The other details of the construction and function are the same as in the first embodiment described hereinbefore, and will not be described again.

<Sixth Embodiment>

Figure 6:
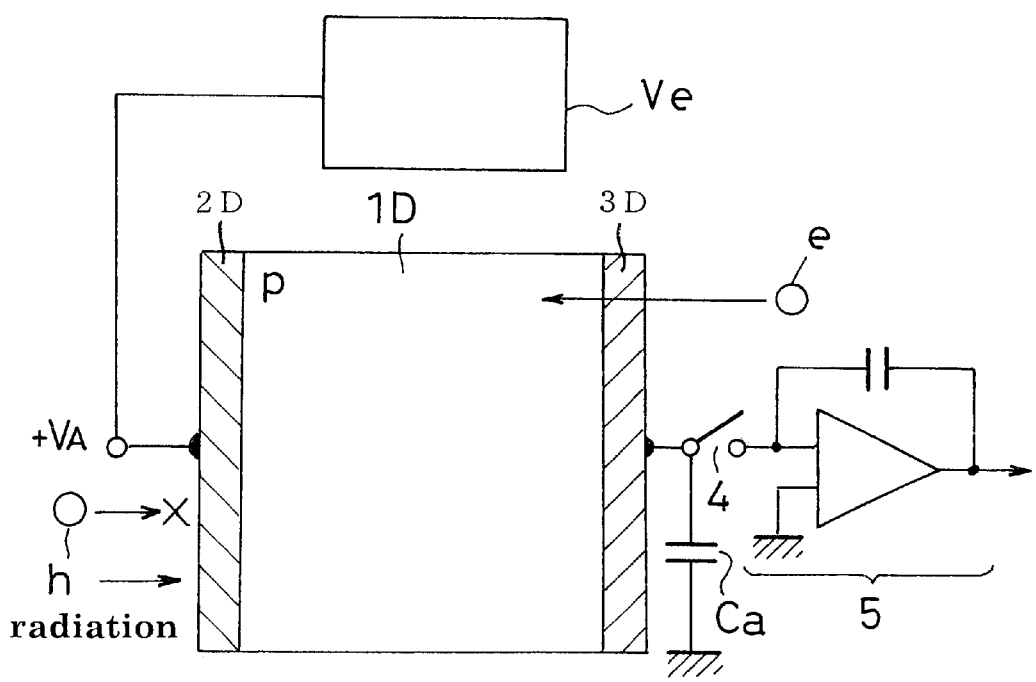
FIG. 6 is a schematic view showing a basic construction of a principal portion of a radiation detecting apparatus according to the fourth aspect of this invention.
Figure 14:
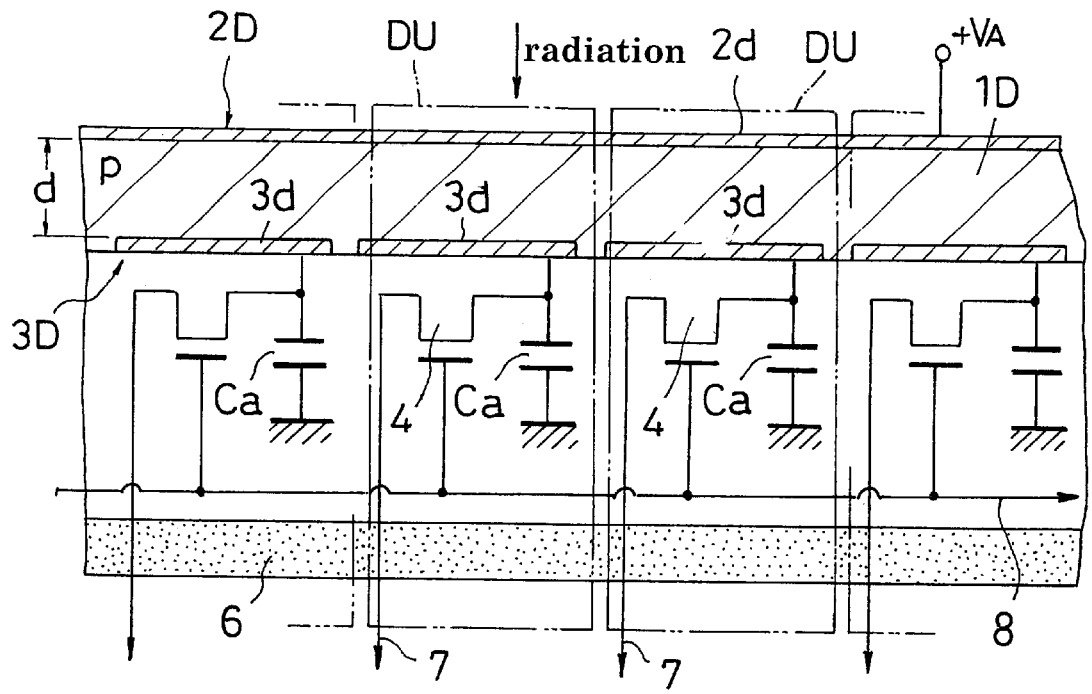
FIG. 14 is a schematic sectional view showing a radiation sensor in a sixth embodiment.

A sixth embodiment (embodiment according to the fourth aspect of the invention) will be described next. FIG. 6 is a schematic view showing a basic construction of a principal portion of a radiation detecting apparatus in the sixth embodiment. FIG. 14 is a schematic sectional view showing a radiation sensor in the sixth embodiment.

In the radiation detecting apparatus in the sixth embodiment, as shown in FIGS. 6 and 14, a positive bias voltage $+V_A$ is applied to the surface electrode 2b. The surface electrode 2b and carrier collection electrodes 3b are both formed of a metal such as ITO, Ti or the like which forms Schottky junctions with a p-type semiconductor layer 1D. The p-type semiconductor layer 1D is similar to what is shown in the fifth embodiment, and is formed of a compound semiconductor such as CdZnTe, for example.

In the sixth embodiment, the bias voltage is applied in the backward direction to the Schottky junction formed between the semiconductor layer 1D and surface electrode 2d, to provide a hole injection inhibiting structure 2D on the voltage application electrode side. The bias voltage is applied in the forward direction to the Schottky junctions formed between the semiconductor layer 1D and carrier collection electrodes 3d to provide an electron injection permitting structure 3D on the carrier collection electrode side.

The electron injection permitting structure 3D may be in the form of n-type layers of semiconductor film or organic film of low specific resistance formed between the semiconductor layer 1D and carrier collection electrodes 3d.

In the sixth embodiment, the carrier collection electrodes 3b may be formed of Au, Pt or the like which forms ohmic junctions with the p-type semiconductor. However, this usually is undesirable since, in the case of a heavy metal such as Au or Pt, metal atoms could infiltrate into the thin film transistor forming the switching elements 4 below, thereby to degrade its property.

The other details of the construction and function are the same as in the first embodiment described hereinbefore, and will not be described again.

<Seventh Embodiment>

Figure 15:
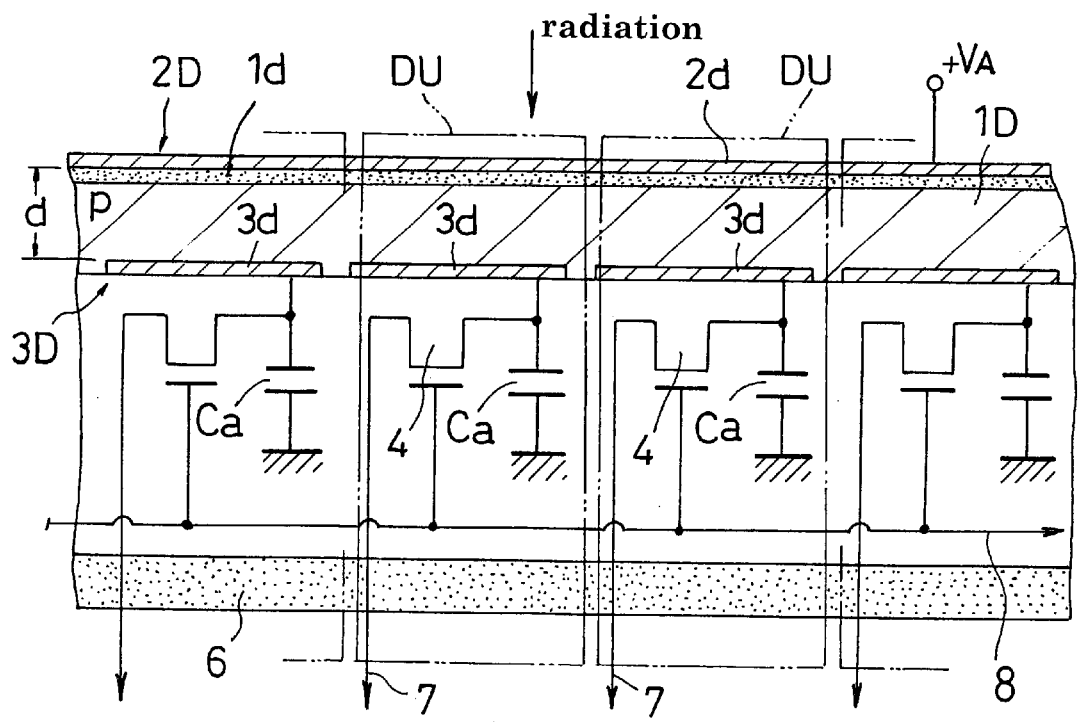
FIG. 15 is a schematic sectional view showing a radiation sensor in a seventh embodiment.

A seventh embodiment (another embodiment according to the fourth aspect of the invention) will be described next. FIG. 15 is a schematic sectional view showing a radiation sensor in the seventh embodiment.

As shown in FIG. 15, a radiation detecting apparatus in the seventh embodiment includes an n-type layer 1d of semiconductor film or organic film of low specific resistance formed between the surface electrode 2d and p-type semiconductor layer 1D. The p-type semiconductor layer 1D is similar to what is shown in the fifth and sixth embodiments. A bias voltage is applied in the backward direction to a PN junction between the semiconductor layer 1D and n-type layer 1d to provide a hole injection inhibiting structure 2D on the voltage application electrode side. The surface electrode 2d need not be formed of a material that provides a Schottky junction. The semiconductor film of low specific resistance for forming the n-type layer 1d may be CdS or $CeO_2$, for example. The organic film may be polycarbonate or the like mixed with an electron transfer agent. The other details of the construction and function are the same as in the first embodiment described hereinbefore, and will not be described again.

This invention is not limited to the foregoing embodiments, but may be modified as follows:

(1) In the fifth to seventh embodiments, the compound semiconductor is CdZnTe. However, CdTe and $PbI_2$ may also be used as the compound semiconductor. It is also possible to use halogen-dope amorphous selenium doped with a halogen such as Cl.

(2) In the described embodiments, the surface electrode and carrier collection electrodes are formed of metal. Instead, n-type semiconductors such as CdS and $CeO_2$ and p-type semiconductors such as $Sb_2Te_3$ and $Sb_2S_3$ may be used where appropriate.

(3) The radiation detecting apparatus in the first to fourth embodiments each include an area sensor with numerous detecting elements DU arranged in matrix form. This construction may be modified to include a line sensor with a plurality of detecting elements DU arranged vertically or horizontally in a single column or row, or to include only one detecting element DU.

(4) The radiation detected by the radiation detecting apparatus according to this invention is not limited to X rays. The apparatus is intended for all types of radiation.

The present invention may be embodied in other specific forms without departing from the spirit or essential attributes thereof and, accordingly, reference should be made to the appended claims, rather than to the foregoing specification, as indicating the scope of the invention.

What is claimed is:

1. A radiation detecting apparatus for converting incident radiation into electric signals, comprising:

a radiation sensitive semiconductor layer for generating carriers in form of electron-hole pairs in response to the incident radiation;

a pair of electrodes formed on opposite surfaces of said semiconductor layer, respectively, one of said electrodes being a voltage application electrode to which a negative bias voltage is applied, the other electrode being a carrier collection electrode;

a charge storing capacitor connected to said carrier collection electrode for storing charges generated by movement of the carriers in said semiconductor layer;

a switching element connected to said capacitor, said switching element being turned off when the charges accumulate in said capacitor, and turned on when taking the charges out of said capacitor; and charge-to-voltage converting means for converting the charges taken out of said capacitor through said switching element into voltage signals acting as radiation detection signals;

wherein said semiconductor layer is formed of one of an n-type amorphous semiconductor and an n-type polycrystal semiconductor, both being of high specific resistance, with a $\mu\tau$ product of holes being larger than a $\mu\tau$ product of electrons, the $\mu\tau$ product being a product of mobility $\mu$ and mean life $\tau$ of the electrons and holes generated by the incident radiation; and wherein said semiconductor layer has a structure formed on a voltage application electrode side thereof for inhibiting injection of electrons, and a structure formed on a carrier collection electrode side for permitting injection of holes.

2. A radiation detecting apparatus as defined in claim 1, wherein the bias voltage applied to said voltage application electrode has a value within a range where an absolute value $|V_A|$ of the bias voltage is $|V_A| > d^2/\mu\tau_L$, where d is a distance between the electrodes, and $\mu\tau_L$ is the larger of the $\mu\tau$ products of the carriers.

3. A radiation detecting apparatus as defined in claim 1, wherein said semiconductor layer is formed of one of non-dope amorphous selenium doped with no impurity, and alkali-dope amorphous selenium doped with an alkali metal.

4. A radiation detecting apparatus as defined in claim 1, wherein said structure for inhibiting injection of electrons comprises a Schottky junction formed between said semiconductor layer and said voltage application electrode.

5. A radiation detecting apparatus as defined in claim 1, wherein said structure for inhibiting injection of electrons comprises a p-type layer of one of a semiconductor film and an organic film, both being of low specific resistance, formed between said semiconductor layer and said voltage application electrode.

6. A radiation detecting apparatus as defined in claim 1, wherein said structure for permitting injection of holes comprises an ohmic junction formed between said semiconductor layer and said carrier collection electrode.

7. A radiation detecting apparatus as defined in claim 1, wherein said structure for permitting injection of holes comprises a carrier selective injection layer of one of a p-type semiconductor film and a p-type organic film which tend to inject holes rather than electrons, formed between said semiconductor layer and said carrier collection electrode.

8. A radiation detecting apparatus as defined in claim 1, wherein said apparatus includes a plurality of detecting elements in a two-dimensional arrangement, each having at least said semiconductor layer, said voltage application electrode, said carrier collection electrode, said charge storing capacitor and said switching element.

9. A radiation detecting apparatus for converting incident radiation into electric signals, comprising:
  a radiation sensitive semiconductor layer for generating carriers in form of electron-hole pairs in response to the incident radiation;
  a pair of electrodes formed on opposite surfaces of said semiconductor layer, respectively, one of said electrodes being a voltage application electrode to which a positive bias voltage is applied, the other electrode being a carrier collection electrode;
  a charge storing capacitor connected to said carrier collection electrode for storing charges generated by movement of the carriers in said semiconductor layer;
  a switching element connected to said capacitor, said switching element being turned off when the charges accumulate in said capacitor, and turned on when taking the charges out of said capacitor; and
  charge-to-voltage converting means for converting the charges taken out of said capacitor through said switching element into voltage signals acting as radiation detection signals;
  wherein said semiconductor layer is formed of one of an n-type amorphous semiconductor and an n-type polycrystal semiconductor, both being of high specific resistance, with a $\mu\tau$ product of holes being larger than a $\mu\tau$ product of electrons, the $\mu\tau$ product being a product of mobility $\mu$ and mean life $\tau$ of the electrons and holes generated by the incident radiation; and
  wherein said semiconductor layer has a structure formed on a voltage application electrode side thereof for permitting injection of holes, and a structure formed on a carrier collection electrode side for inhibiting injection of electrons.

10. A radiation detecting apparatus as defined in claim 9, wherein the bias voltage applied to said voltage application electrode has a value within a range where an absolute value $|V_A|$ of the bias voltage is $|V_A|>d^2/\mu\tau_L$, where d is a distance between the electrodes, and $\mu\tau_L$ is the larger of the $\mu\tau$ products of the carriers.

11. A radiation detecting apparatus as defined in claim 9, wherein said semiconductor layer is formed of one of non-dope amorphous selenium doped with no impurity, and alkali-dope amorphous selenium doped with an alkali metal.

12. A radiation detecting apparatus as defined in claim 9, wherein said structure for permitting injection of holes comprises an ohmic junction formed between said semiconductor layer and said voltage application electrode.

13. A radiation detecting apparatus as defined in claim 9, wherein said structure for permitting injection of holes comprises a p-type layer of one of semiconductor film and organic film, both being of low specific resistance, formed between said semiconductor layer and said voltage application electrode.

14. A radiation detecting apparatus as defined in claim 9, wherein said structure for inhibiting injection of electrons comprises a p-type layer of one of a semiconductor film and an organic film, both being of low specific resistance, formed between said semiconductor layer and said carrier collection electrode.

15. A radiation detecting apparatus as defined in claim 9, wherein said apparatus includes a plurality of detecting elements in a two-dimensional arrangement, each having at least said semiconductor layer, said voltage application electrode, said carrier collection electrode, said charge storing capacitor and said switching element.

16. A radiation detecting apparatus for converting incident radiation into electric signals, comprising:
  a radiation sensitive semiconductor layer for generating carriers in form of electron-hole pairs in response to the incident radiation;
  a pair of electrodes formed on opposite surfaces of said semiconductor layer, respectively, one of said electrodes being a voltage application electrode to which a negative bias voltage is applied, the other electrode being a carrier collection electrode;
  a charge storing capacitor connected to said carrier collection electrode for storing charges generated by movement of the carriers in said semiconductor layer;
  a switching element connected to said capacitor, said switching element being turned off when the charges accumulate in said capacitor, and turned on when taking the charges out of said capacitor; and
  charge-to-voltage converting means for converting the charges taken out of said capacitor through said switching element into voltage signals acting as radiation detection signals;
  wherein said semiconductor layer is formed of one of a p-type amorphous semiconductor and a p-type polycrystal semiconductor, both being of high specific resistance, with a $\mu\tau$ product of electrons being larger than a $\mu\tau$ product of holes, the $\mu\tau$ product being a product of mobility $\mu$ and mean life $\tau$ of the electrons and holes generated by the incident radiation; and
  wherein said semiconductor layer has a structure formed on a voltage application electrode side thereof for permitting injection of electrons, and a structure formed on a carrier collection electrode side for inhibiting injection of holes.

17. A radiation detecting apparatus as defined in claim 16, wherein the bias voltage applied to said voltage application electrode has a value within a range where an absolute value $|V_A|$ of the bias voltage is $|V_A|>d^2/\mu\tau_L$, where d is a distance between the electrodes, and $\mu\tau_L$ is the larger of the $\mu\tau$ products of the carriers.

18. A radiation detecting apparatus as defined in claim 16, wherein said semiconductor layer comprises a compound semiconductor selected from the group consisting of CdZnTe, CdTe and PbI$_2$.

19. A radiation detecting apparatus as defined in claim 16, wherein said semiconductor layer comprises a halogen-dope amorphous selenium doped with a halogen.

20. A radiation detecting apparatus as defined in claim 16, wherein said structure for permitting injection of electrons comprises an ohmic junction formed between said semiconductor layer and said voltage application electrode.

21. A radiation detecting apparatus as defined in claim 16, wherein said structure for permitting injection of electrons comprises an n-type layer of one of a semiconductor film and an organic film, both being of low specific resistance, formed between said semiconductor layer and said voltage application electrode.

22. A radiation detecting apparatus as defined in claim 16, wherein said structure for inhibiting injection of holes comprises a Schottky junction formed between said semiconductor layer and said carrier collection electrode.

23. A radiation detecting apparatus as defined in claim 16, wherein said structure for inhibiting injection of holes comprises an n-type layer of one of a semiconductor film and an organic film, both being of low specific resistance, formed between said semiconductor layer and said carrier collection electrode.

24. A radiation detecting apparatus as defined in claim 16, wherein said apparatus includes a plurality of detecting elements in a two-dimensional arrangement, each having at least said semiconductor layer, said voltage application electrode, said carrier collection electrode, said charge storing capacitor and said switching element.

25. A radiation detecting apparatus for converting incident radiation into electric signals, comprising:

a radiation sensitive semiconductor layer for generating carriers in form of electron-hole pairs in response to the incident radiation;

a pair of electrodes formed on opposite surfaces of said semiconductor layer, respectively, one of said electrodes being a voltage application electrode to which a positive bias voltage is applied, the other electrode being a carrier collection electrode;

a charge storing capacitor connected to said carrier collection electrode for storing charges generated by movement of the carriers in said semiconductor layer;

a switching element connected to said capacitor, said switching element being turned off when the charges accumulate in said capacitor, and turned on when taking the charges out of said capacitor; and charge-to-voltage converting means for converting the charges taken out of said capacitor through said switching element into voltage signals acting as radiation detection signals;

wherein said semiconductor layer is formed of one of a p-type amorphous semiconductor and a p-type polycrystal semiconductor, both being of high specific resistance, with a $\mu\tau$ product of electrons being larger than a $\mu\tau$ product of holes, the $\mu\tau$ product being a product of mobility $\mu$ and mean life $\tau$ of the electrons and holes generated by the incident radiation; and wherein said semiconductor layer has a structure formed on a voltage application electrode side thereof for inhibiting injection of holes, and a structure formed on a carrier collection electrode side for permitting injection of electrons.

26. A radiation detecting apparatus as defined in claim 25, wherein the bias voltage applied to said voltage application electrode has a value within a range where an absolute value $|V_A|$ of the bias voltage is $|V_A|>d^2/\mu\tau_L$, where d is a distance between the electrodes, and $\mu\tau_L$ is the larger of the $\mu\tau$ products of the carriers.

27. A radiation detecting apparatus as defined in claim 25, wherein said semiconductor layer comprises a compound semiconductor selected from the group consisting of CdZnTe, CdTe and $PbI_2$.

28. A radiation detecting apparatus as defined in claim 25, wherein said semiconductor layer comprises a halogen-dope amorphous selenium doped with a halogen.

29. A radiation detecting apparatus as defined in claim 25, wherein said structure for inhibiting injection of holes comprises a Schottky junction formed between said semiconductor layer and said voltage application electrode.

30. A radiation detecting apparatus as defined in claim 25, wherein said structure for inhibiting injection of holes comprises an n-type layer of one of a semiconductor film and an organic film, both being of low specific resistance, formed between said semiconductor layer and said voltage application electrode.

31. A radiation detecting apparatus as defined in claim 25, wherein said structure for permitting injection of electrons comprises a Schottky junction formed between said semiconductor layer and said carrier collection electrode.

32. A radiation detecting apparatus as defined in claim 25, wherein said structure for permitting injection of electrons comprises an n-type layer of one of a semiconductor film and an organic film, both being of low specific resistance, formed between said semiconductor layer and said carrier collection electrode.

33. A radiation detecting apparatus as defined in claim 25, wherein said apparatus includes a plurality of detecting elements in a two-dimensional arrangement, each having at least said semiconductor layer, said voltage application electrode, said carrier collection electrode, said charge storing capacitor and said switching element.

* * * * *